(12) United States Patent
Stanislav et al.

(10) Patent No.: US 10,636,622 B2
(45) Date of Patent: Apr. 28, 2020

(54) SCANNING TRANSMISSION ELECTRON MICROSCOPE

(71) Applicants: TESCAN Brno s.r.o., Brno (CZ); TESCAN TEMPE, LLC., Tempe, AZ (US)

(72) Inventors: Petras Stanislav, Strakonice-Predni Ptakovice (CZ); Lencova Bohumila, Kurim (CZ); Benner Gerd Ludwig, Aalen (DE); Jon Karl Weiss, Tempe, AZ (US)

(73) Assignee: TESCAN ORSAY HOLDING, A.S., Brno (CZ)

( * ) Notice: Subject to any disclaimer, the term of this patent is extended or adjusted under 35 U.S.C. 154(b) by 21 days.

(21) Appl. No.: 15/926,623

(22) Filed: Mar. 20, 2018

(65) Prior Publication Data

US 2018/0269031 A1    Sep. 20, 2018

(30) Foreign Application Priority Data

Mar. 20, 2017  (EP) .................................... 17000451

(51) Int. Cl.
| | | |
|---|---|---|
| *H01J 37/26* | (2006.01) | |
| *G01N 23/20058* | (2018.01) | |
| *H01J 37/244* | (2006.01) | |
| *H01J 37/20* | (2006.01) | |
| *H01J 37/295* | (2006.01) | |
| *H01J 37/28* | (2006.01) | |

(52) U.S. Cl.
CPC ...... *H01J 37/268* (2013.01); *G01N 23/20058* (2013.01); *H01J 37/20* (2013.01); *H01J 37/244* (2013.01); *H01J 37/28* (2013.01); *H01J 37/2955* (2013.01); *H01J 2237/1505* (2013.01); *H01J 2237/1506* (2013.01); *H01J 2237/1507* (2013.01); *H01J 2237/1508* (2013.01); *H01J 2237/2802* (2013.01)

(58) Field of Classification Search
CPC .......... H01J 37/00; H01J 37/02; H01J 37/023; H01J 37/04; H01J 37/07; H01J 37/10; H01J 37/12; H01J 37/14; H01J 37/141; H01J 37/147; H01J 37/1471; H01J 37/1472; H01J 37/1474; H01J 37/1475; H01J 37/1477; H01J 37/15; H01J 37/26; H01J 37/261; H01J 37/266; H01J 37/268
USPC ................................ 250/306, 307, 310, 311
See application file for complete search history.

(56) References Cited

U.S. PATENT DOCUMENTS

| | | | |
|---|---|---|---|
| 4,839,520 A * | 6/1989 | Garth ...................... | H01J 37/04 250/396 R |
| 8,253,099 B2 | 8/2012 | Nicolopoulos et al. | |
| 2007/0023659 A1 * | 2/2007 | Sergeevich ...... | G01N 23/20058 250/311 |

(Continued)

*Primary Examiner* — Jason L McCormack
(74) *Attorney, Agent, or Firm* — Thedford I Hitaffer; Hitaffer & Hitaffer, PLLC

(57) ABSTRACT

A scanning transmission electron microscope is adapted to acquire high quality precession electron diffraction (PED) patterns by means of separated scanning deflectors and precession deflectors. Magnetic or electrostatic deflectors may be used for scanning and for precession. This enables independent optimization of parameters for each deflection system to achieve a broad operating range simultaneously for both deflection systems.

16 Claims, 5 Drawing Sheets

(56) References Cited

U.S. PATENT DOCUMENTS

| | | | |
|---|---|---|---|
| 2012/0001068 A1* | 1/2012 | He | G01N 23/20058 250/307 |
| 2012/0025094 A1* | 2/2012 | Benner | G01N 23/20058 250/396 R |
| 2014/0061464 A1* | 3/2014 | Lazic | H01J 37/153 250/307 |
| 2015/0076346 A1* | 3/2015 | Weiss | H01J 37/26 250/307 |
| 2016/0118219 A1* | 4/2016 | Potocek | H01J 37/28 250/307 |

* cited by examiner

SCANNING TRANSMISSION ELECTRON MICROSCOPE

CROSS-REFERENCE TO RELATED APPLICATION

This application is claims priority from European Patent Application No. 17000451.9, filed Mar. 20, 2017, the disclosure of which is incorporated herein by reference.

FIELD OF THE INVENTION

The present invention relates to a scanning transmission electron microscope (STEM) adapted for observing precession electron diffraction patterns recorded from one or a multitude of positions on a specimen.

BACKGROUND OF THE INVENTION

In a transmission electron microscope (TEM) a beam of high energy (typically 20-300 keV) electrons is directed onto a thin specimen. The electrons that are scattered by the specimen are analyzed, along with other secondary signals that are produced by the interaction of the incident electrons with the specimen. The electrons which pass through the specimen (the transmitted electrons) are scattered in an angular distribution, which is dependent on the atomic structure of the specimen, the thickness of the specimen, the energy of the electrons and the relative orientation between the atomic structure and the electron beam direction. The measured angular distribution of the transmitted electrons is referred to as the electron diffraction (ED) pattern, because the shape of the pattern is the result of interference of the electrons scattered from different atoms in the specimen in a process known as diffraction. ED patterns can be used to determine the atomic structure of materials.

The key advantage of a TEM in producing ED patterns is the possibility of focusing the incident electrons into a small area with dimensions approaching one nanometer, thus enabling the analysis of atomic structure from nanometer-sized regions. Furthermore, with the ability to systematically move the small focused incident electron beam to different positions on the specimen in a scanning transmission electron microscope (STEM), it is possible to analyze the spatial variations in atomic structure due to material characteristics such as polycrystalline grain structure elastic and plastic strain. These measurements can be made with a spatial resolution of one nanometer or better.

Automated analysis of ED patterns from crystalline materials is complicated by an effect known as dynamical diffraction, which arises from a complex interaction between many electrons scattered in different directions. This effect is strongly dependent on specimen thickness and by the relative orientation between the electron beam direction and the specimen's crystal axes. The net effect is that small variations in crystal thickness and orientation lead to very large changes in the ED pattern. This complicates analysis of the ED patterns because there is no independent way to measure the thickness or orientation of the specimen.

Precession electron diffraction (PED) was invented to simplify automated analysis of ED patterns. PED is based on the fact that the dynamical diffraction effects are independent of the incident beam direction, whereas other diffracted intensity (the so-called kinematical diffraction) is relative to the incident beam direction. Therefore, if the incident electron beam is tilted, the kinematical part of the ED pattern shifts (since the ED pattern is an angular distribution), whereas the dynamical part of the pattern doesn't move. Then if the diffraction pattern is shifted in order to keep the kinematical diffraction pattern fixed while the beam is tilted (a process known as "tilt descanning"), the dynamical diffraction intensity shifts. If the tilt angle of the electron beam is changed rapidly in some pattern while recording an ED pattern, and the ED pattern is descanned to keep the kinematical part of the pattern fixed, the dynamical part of the pattern is "smeared out" and becomes a relatively uniform background behind the kinematical part of the pattern (which is generally a set of small bright spots).

The most common pattern in which the electron beam is tilted is a so-called precession pattern, where the tilt angle relative to the microscope optical axis (the precession angle) is fixed, and the tilted beam is rotated about the optical axis by changing the azimuthal angle at a constant rate. The beam azimuth is typically rotated through an entire circle (360 degrees) during the recording of one ED pattern, which is then referred to as a PED pattern.

The beam is shifted and tilted In a TEM/STEM by a two-stage deflection system, where two deflectors are positioned centered around the optical axis at different distances from the specimen upstream of where the incident beam enters the pre-field objective lens. The deflectors can be either electromagnetic or electrostatic. The balance between the two deflector stages is a fixed value (one for shift and another for tilt) which defines the beam shift/tilt "purity". Additionally, there are two pairs of deflectors at 90 degree angles with respect to each other which can produce shift and tilt in two orthogonal directions. Finally, there are two pairs of two-stage deflectors on the exit side of the specimen for descanning the beam shift and tilt.

In most existing TEM/STEMs, a single set of two-stage deflection coils are used for both beam shift and for beam tilt, like in U.S. Pat. No. 8,253,099B2. The signals which drive each of the shift and tilt deflectors are added before being sent to the deflectors. A limitation of this arrangement is that the strength of the deflectors needed for shift and for tilt can be very different (by 1-2 orders of magnitude). This makes it difficult to add the shift and tilt signals and still maintain the necessary dynamic range in the summed signal to accurately represent both signals. Additionally, the characteristic frequencies of the shift and tilt signals are often very different, so it is difficult to design a single deflector circuit with the proper frequency response to accurately produce both the shift and tilt deflections. Finally, the optimum positions for the beam shift deflectors might not be at the same position as the deflectors for beam tilt.

Although both scanning and precession movements may be provided using a STEM (simultaneously or separately), the needs concerning deflection amplitude, stability and dynamic range are different.

SUMMARY OF THE INVENTION

The object of the present invention is to provide a scanning transmission electron microscope (STEM) configured to record precession electron diffraction (PED) patterns. For this purpose, the scanning deflection system and the precession deflection system are separated, wherein both of them are located between a sample and an electron beam source in the column of the STEM. Preferably, these two deflection systems have independent signal generators. A STEM according to the invention allows to provide PED in high operating range.

Although the invention is preferably used for obtaining PED patterns, it is also suitable for obtaining general scattering electron distribution images.

The invention is related to a scanning transmission electron microscope comprising an electron beam source to generate a primary electron beam, at least one condenser lens, a scanning deflection system for shifting said primary electron beam over the sample, an objective lens for generating an electron diffraction image, a sample holder to hold a sample in the path of the primary electron beam, at least one projection lens, at least one detector to detect scattered transmitted electrons and an additional precession deflection system located between the electron beam source and the sample. The objective lens is usually of the in-lens type.

The primary electron beam generated by the electron beam source is formed by means of at least one condenser lens and at least one aperture. Subsequently the primary electron beam passes the scanning deflection system and the precession deflection system. The scanning deflection system shifts the primary electron beam out of the optical axis in order to scan over the sample. The precession deflection system enables the primary electron beam to tilt and rotate around the optical axis respectively around the shifted axis. Both of these deflection systems are designed as one-stage or two-stage deflection systems, wherein every stage is able to deflect the primary electron beam in two directions (x and y axis). After passing through the scanning deflection system and the precession deflection system, the primary electron beam is finely focused to a spot on the sample by the objective lens. Because the sample is located in the magnetic field of the objective lens, the electrons that transmitted through the sample create a diffraction image by means of magnetic field of the objective lens downstream of the sample. The objective lens is followed by the projection lens system. The projection lens system consists of at least one projection lens, but preferably consists of more projection lenses. The projection lens system projects the image of PED pattern on the detector, where the PED pattern is detected and can be displayed on the monitor or stored and/or further processed. The detector may be any commonly used two-dimensional multi-pixel detector.

For scanning, a higher deflection strength is needed in order to give a large scanning field on the specimen. Therefore, the scanning defection system is preferably realized with magnetic deflectors (for example electromagnetic coils). The precession deflection system can be realized with either electromagnetic or electrostatic deflectors. Their signal generators may be separated from each other.

Both scanning deflection system and precession deflection system may be arranged like two-stage deflection systems. Two stages of deflectors of these two deflection systems can be positioned concentrically in two planes perpendicular to the optical axis, so that the first stages of the scanning deflection system and the precession deflection system are placed in one plane and the second stages of the scanning deflection system and the precession deflection system are placed in the other plane. Alternatively, all deflectors may be placed separately along the optical axis.

The STEM according to the invention may further comprise a de-scanning system and a de-precession system arranged between the sample and the projection lens system. These deflection systems compensate the action of the scanning deflection system and the precession deflection system and return the electron beam back to the optical axis after passing through the sample. The transmitted electron beam passes through the projection lenses on the optical axis, so that the aberrations are reduced. Said de-scanning and de-precession deflection systems can be realized similarly to the scanning deflection system and the precession deflection system, i.e. such as magnetic and/or electrostatic deflectors, respectively. They may also have independent signal generators.

The possibilities of arranging the de-scanning system and the de-precession system in relation to each other are the same as for the deflectors of the scanning deflection system and the precession deflection system.

Between the projection lens system and the detector, there may be added a detector scanning system for scanning the diffraction image over the detection plane of the detector. This detector scanning system allows obtaining more images within one read-out interval of the detector because the detector reads the signal in certain time intervals.

DESCRIPTION OF THE INVENTION

Figure 1:
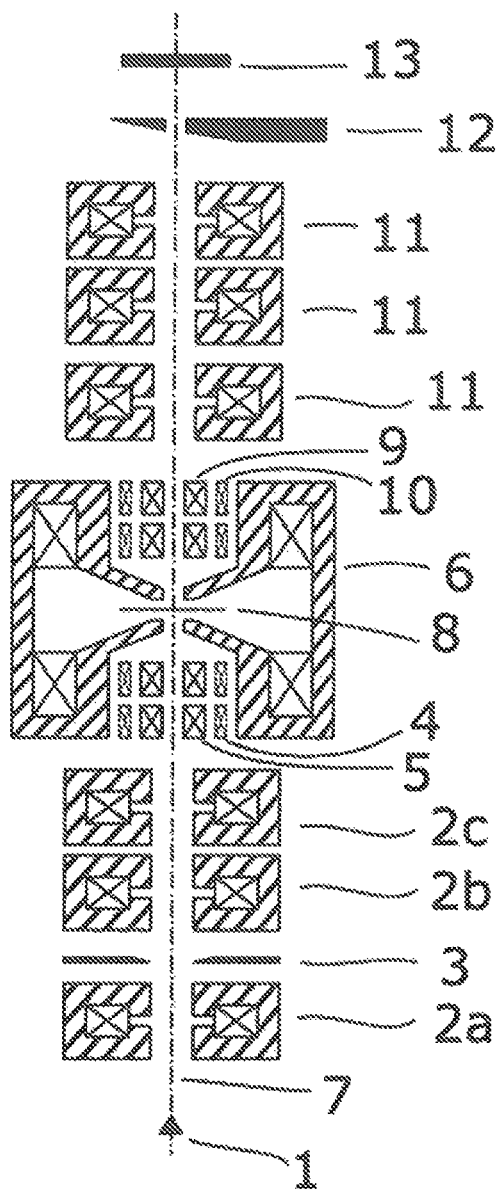
FIG. 1 is a schematic illustration of a scanning transmission electron microscope according to the first embodiment.

The FIG. 1 schematically illustrates the scanning transmission electron microscope (STEM) according to the invention. There is an electron beam source 1, three condenser lenses 2a, 2 b, 2c and an aperture 3 between the two condenser lenses 2a and 2b. Downstream of the condenser lenses 2a, 2b, 2c, there are located a scanning deflection system 4 and a precession deflection system 5. Both of these deflection systems comprise two stages of deflection coils and the corresponding signal generator (not shown), each capable of deflecting the primary electron beam in two perpendicular directions. Two stages of deflectors of these two deflection systems 4, 5 are positioned concentrically in two planes perpendicular to the optical axis, so that the first stages of the scanning deflection system 4 and the precession deflection system 5 are placed in one plane and the second stages of the scanning deflection system 4 and the precession deflection system 5 are placed in the other plane. The objective lens 6 consists of two coils and a yoke with two-pole pieces. Between the pole pieces there is a gap, in which a sample holder 8 is located. Downstream of the objective lens 6 there is the de-precession system 9 and the de-scanning system 10. The de-precession system 9 and the de-scanning system 10 (similarly to the scanning deflection system 4 and the precession deflection system 5) comprise two stages of deflection coils and signal generators (not shown). The scanning deflection system 4 and the precession deflection system 5 are arranged concentrically around the optical axis 7. Then there is the projection lens system, which consists of three projection lenses 11. Finally, there is a detector 12 and a camera 13.

The electron beam source 1 generates the primary electron beam. The electron beam current is adjusted by the first condenser lens 2a and an aperture 3. The second and the third condenser lens 2b and 2c are used to set a suitable spot size and convergence angle. Then the primary electron beam goes through the scanning deflection system 4 and the precession deflection system 5. The scanning deflection system 4 shifts the primary electron beam out of the optical axis 7 in order to scan over the sample. The precession deflection system 5 enables the primary electron beam to tilt with respect to the optical axis 7 and to rotate the tilted primary electron beam around the optical axis 7. Then the primary electron beam enters the objective lens 6 and it is focused on the sample. The sample is held by the sample holder 8 in the center of the gap, or the sample may be placed closer to the one pole piece of the objective lens 6. The primary electron beam scans the sample step by step, and at every position, the primary electron beam makes the precession movement (at least one circle). The primary electron beam is scattered by the sample in an angular scattering distribution. The magnetic field of the objective lens 6 downstream of the sample generates a PED pattern close to the lower pole piece of the objective lens 6. The transmitted electron beam passes the de-precession system 9 and the de-scanning system 10. These systems 9, 10, operated synchronously to the corresponding precession deflection system 5 and scanning deflection system 4, return the transmitted electron beam back to the optical axis 7, resulting in a stationary PED pattern, and a transmitted electron beam passing through the projection lenses 11 symmetrical to the optical axis 7. The PED pattern is transferred by means of the projection lenses 11 on the detector 12 to obtain a dark field and/or bright field image, or to record a PED pattern on the camera 13.

This arrangement allows an increase in the deflection strength of the scanning deflection system 4 in order to achieve larger scan fields. Similarly, an increase in the deflection strength of the precession deflection system 5 leads to a larger precession angle.

In principle, the precession deflection system 5 can be used for scanning the beam as well and vice versa.

Figure 2:
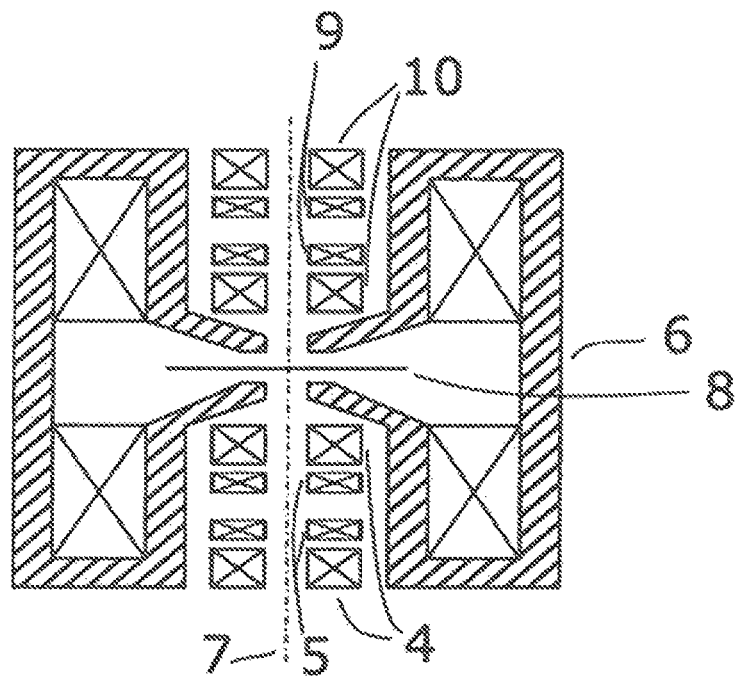
FIG. 2 is a schematic illustration of an arrangement of an objective lens and deflection systems according to the second embodiment, where the scanning deflection system, the precession deflection system, the de-precession system and the de-scanning system are arranged along the optical axis.

The FIG. 2 schematically illustrates the scanning deflection system 4, the precession deflection system 5, objective lens 6, the de-precession system 9 and the de-scanning system 10, according to the second embodiment. This arrangement may replace the corresponding parts from the first embodiment. The objective lens 6 comprises two coils and a yoke with two pole pieces. Between the pole pieces a sample holder 8 is placed. Both the scanning deflection system 4 and the precession deflection system 5 are provided as two stages of electromagnetic coils. These deflectors are arranged along the optical axis 7. The precession deflection system 5 is placed between the first and second stage of the scanning deflection system 4. Similarly, the de-scanning system 10 and the de-precession system 9 are provided as two-stage deflectors, preferably electromagnetic coils, placed along the optical axis 7. The de-precession deflectors are placed between the first and the second stage of de-scanning system 10. This combined electrostatic and magnetic deflection system arrangement also can be operated as Wien Filter system, where the backscattered (secondary) electrons can be separated from the primary beam.

Figure 3:
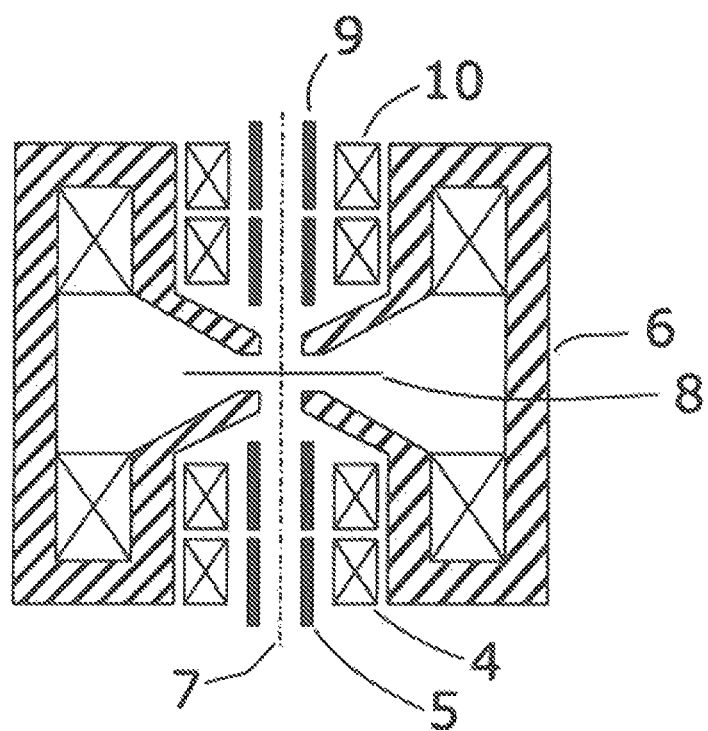
FIG. 3 is a schematic illustration of an arrangement of an objective lens and deflection systems according to the third embodiment, where the precession deflection system and the de-precession system are realized with electrostatic deflectors.

The FIG. 3 shows another embodiment. There is an objective lens 6, a scanning deflection system 4 and a de-scanning system 10 designed as two-stage electromagnetic coils, and a precession deflection system 5 and a de-precession system 9 designed as two-stage electrostatic deflectors. This electrostatic deflector comprises (for deflecting in each direction) two oppositely arranged parallel deflection plates connected to a dynamically fast voltage supply to produce a high deflection speed. The scanning deflection system 4 and the precession deflection system 5 are located concentrically around the optical axis 7. Similarly, the de-scanning system 10 and the de-precession system 9 are located around the optical axis 7. The sample holder 8 holds the sample in the gap of the objective lens 6.

Figure 4:
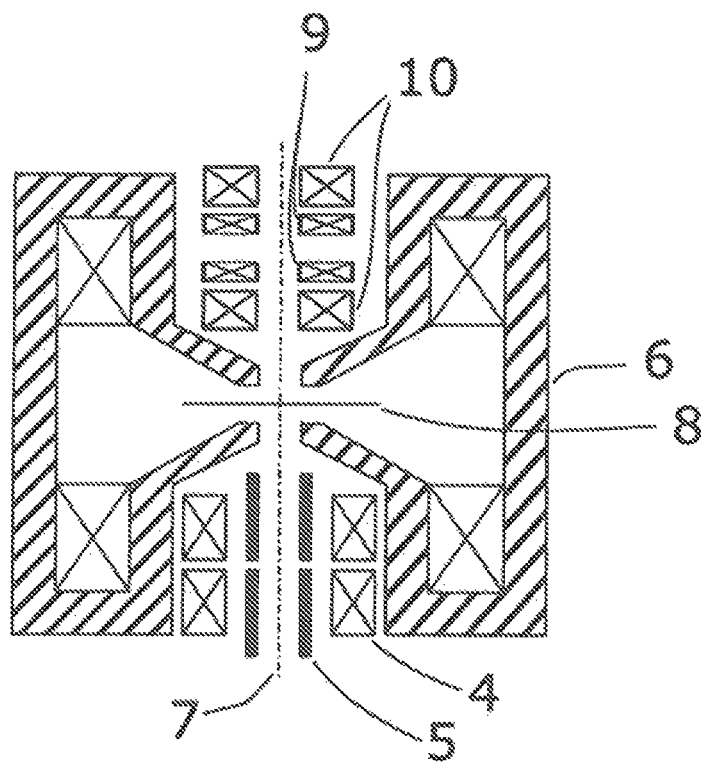
FIG. 4 is a schematic illustration of an arrangement of an objective lens and deflection systems according to the fourth embodiment.

It is possible to combine all of the mentioned STEM arrangements together, as shown in the FIG. 4. In this embodiment, the scanning deflection system 4 is designed as electromagnetic coils and the precession deflection system 5 is designed as electrostatic deflectors (similar to the third embodiment). They are located concentrically around the optical axis 7. The de-scanning system 9 and the de-precession system 10 are designed according to the second embodiment, with magnetic deflectors arranged along the optical axis 7.

Alternatively, the electrostatic deflector may comprise four or eight electrodes.

Figure 5:
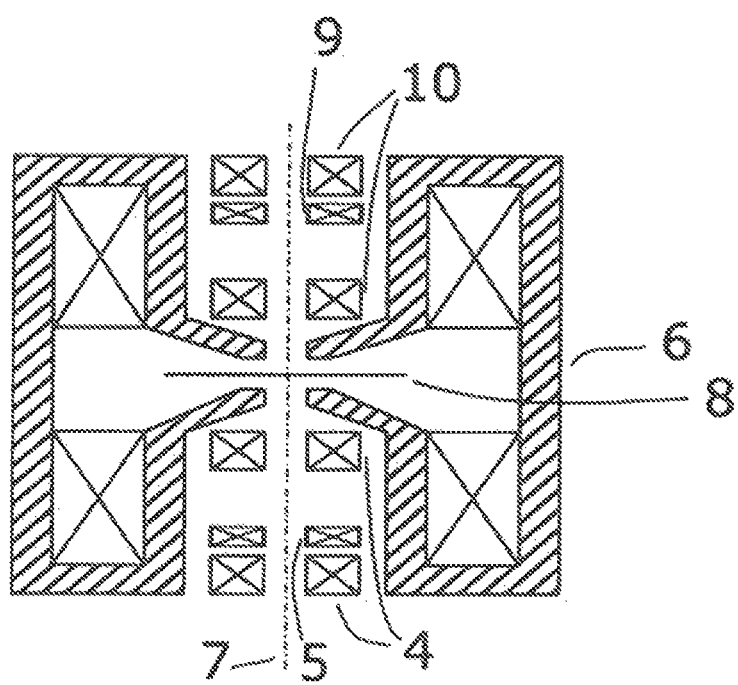
FIG. 5 is a schematic illustration of another arrangement, where the precession deflection system and the de-precession system comprise a one-stage deflector and the scanning deflection system and the de-scanning, deflection system comprise two stages of deflectors.

The FIG. 5 schematically illustrates another possible embodiment according to the invention. The scanning deflection system 4 is provided as a two-stage system of electromagnetic coils, the precession deflection system 5 is provided, as a one-stage system of electromagnetic coils. These deflectors are arranged along the optical axis 7. The precession deflection system 5 is placed between the first and second stage of the scanning deflection system 4. Similarly, the de-scanning system 10 is provided as two-stage deflectors, the de-precession system is provided as a one-stage system, preferably of electromagnetic coils. These systems are placed along the optical axis 7. The de-precession deflectors are placed between the first and the second stage of the de-scanning system 10.

Figure 6:
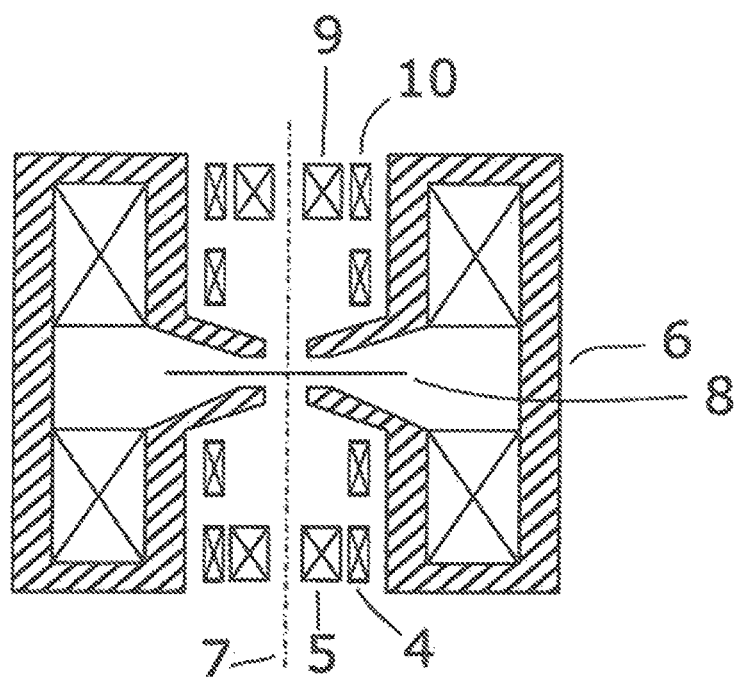
FIG. 6 is schematic illustration of an arrangement with a one-stage precession deflection system and a two-stage scanning deflection system located concentrically around the optical axis.

The FIG. 6 schematically illustrates the embodiment with a two-stage scanning deflection system 4 and a one-stage precession deflection system 5. These deflection systems are located concentrically around the optical axis 7. The first stage of the scanning deflection system 4 is located in the same plane as the precession deflection system 5. In the gap of the objective lens 6 is located the holder 8 to hold a sample in the path of the primary electron beam. There is a two-stage de-scanning system 10 and a one-stage de-precession system 9 located concentrically around the optical axis 7. Accordingly a one-stage de-precession deflection system is arranged in the same plane as the second stage of the de-scanning deflection system.

Figure 7:
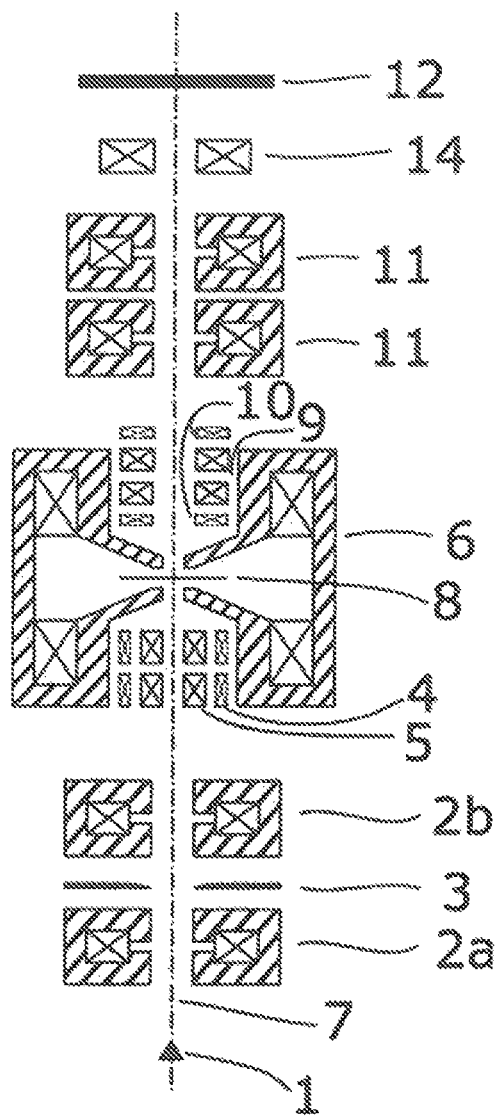
FIG. 7 is a schematic illustration of an arrangement of a scanning transmission electron microscope with an additional detector scanning system.

The FIG. 7 illustrates an embodiment of the STEM according to the presented invention in combination with a detector scanning system 14. The STEM comprises an electron beam source 1, two condenser lenses 2a, 2b and an aperture 3, a scanning deflection system 4 and a precession deflection system 5. The scanning deflection system 4 and the precession deflection system 5 are performed with two-stage magnetic deflectors positioned concentrically around the optical axis 7, e.g. In two planes perpendicular to the optical axis 7, with separate signal generators. The STEM further comprises an objective lens 6, a de-precession system 9 and a de-scanning system 10 designed as magnetic deflectors positioned along the optical axis 7. The STEM further comprises two projection lenses 11, a detector 12 and a detector scanning system 14 located between the projection lens 11 and the detector 12.

Electrons generated in the electron beam source 1 pass the STEM similarly to the first embodiment. The primary electron beam is formed by condenser lenses 2a, 2b and an aperture 3, then it is deflected by the scanning deflection system 4 and the precession deflection system 5. Subsequently it is focused by the objective lens 6 on the sample held in the sample holder 8. The objective lens 6 forms the PED pattern from transmitted electrons. The axially symmetrical positions of the PED pattern are then adjusted by the de-scanning system 10 and the de-precession system 9 and magnified by the projection lenses 11. The transmitted electron beam heading for the detector 12 is shifted by the detector scanning system 14. The detector scanning system 14 deflects the transmitted electron beam out of the optical axis 7, so the PED pattern may be positioned on the detector surface away from the optical axis 7. The PED pattern may be shifted stepwise over the detector 12, The read-out interval of the detector 12 is set up to be long enough for scanning at least two images during one read-out interval. This procedure may increase the effective recording rate of PED patterns and shorten the total operating time.

The scope of the invention is not limited to the above-mentioned embodiments. Other types of objective lens, various detectors, electron beam sources etc. known to the person skilled in the art may be used, while fulfilling the object of the described invention.

LIST OF MARKS

1—electron beam source
2a, 2b, 2c—condenser lens
3—aperture
4—scanning deflection system
5—precession deflection system
6—objective lens
7—optical axis
8—sample holder
5—de-precession system
10—de-scanning system
11—projection lens
12—detector
13—camera
14—detector scanning system

The invention claimed is:

1. A scanning transmission electron microscope comprising an electron beam source to generate a primary electron beam, at least one condenser lens, a scanning deflection system for shifting said primary electron beam over a sample, an objective lens, a sample holder to hold the sample in the path of the primary electron beam, at least one projection lens and at least one detector to detect scattered transmitted electrons, wherein the scanning transmission electron microscope further comprises a precession deflection system located between the beam source and the sample holder,
wherein the scanning deflection system and the precession deflection system each comprises at least one stage including at least one deflector, and
wherein the at least one stage of the scanning deflection system and the at least one stage of the precession deflection system are located concentrically around an optical axis.

2. A scanning transmission electron microscope according to claim 1 wherein the scanning deflection system and the precession deflection system have independent signal generators.

3. A scanning transmission electron microscope according to claim 1 wherein the at least one deflector is an electrostatic deflector.

4. A scanning transmission electron microscope according to claim 1 wherein the scanning deflection system and the precession deflection system are arranged along an optical axis.

5. A scanning transmission electron microscope according to claims 1 wherein the scanning transmission electron microscope further comprises a de-precession system located between the sample holder and the projection lens.

6. A scanning transmission electron microscope according to claim 5 wherein the scanning transmission electron microscope further comprises a de-scanning system located between the sample holder and the projection lens.

7. A scanning transmission electron microscope according to claim 6 wherein the de-precession system or the de-scanning system comprises at least one electrostatic deflector.

8. A scanning transmission electron microscope according to claim 6 wherein the de-scanning system or the de-precession system comprises of two stages of deflectors.

9. A scanning transmission electron microscope comprising an electron beam source to generate a primary electron beam, at least one condenser lens, a scanning deflection system for shifting said primary electron beam over a sample, an objective lens, a sample holder to hold the sample in the path of the primary electron beam, at least one projection lens and at least one detector to detect scattered transmitted electrons wherein the scanning transmission electron microscope further comprises a precession deflection system located between the beam source and the sample holder, and
wherein the scanning transmission electron microscope further comprises a de-precession system located between the sample holder and the projection lens and a de-scanning system located between the sample holder and the projection lens,
wherein the de-scanning system or the de-precession system each comprises at least one stage including at least one deflector, and
wherein the at least one stage of the de-scanning system and the at least one stage of the de-precession system are located concentrically around an optical axis.

10. A scanning transmission electron microscope according to claim 6 wherein the de-scanning system and de-precession system are arranged along the optical axis.

11. A scanning transmission electron microscope according to claim 1 wherein the scanning transmission electron microscope further comprises a detector scanning system.

12. A scanning transmission electron microscope according to claim 9 wherein the scanning deflection system and the precession deflection system have independent signal generators.

13. A scanning transmission electron microscope according to claim 9 wherein the at least one deflector is an electrostatic deflector.

14. A scanning transmission electron microscope according to claim 9 wherein the scanning deflection system and the precession deflection system are arranged along an optical axis.

15. A scanning transmission electron microscope according to claim 9 wherein the de-scanning system and de-precession system are arranged along the optical axis.

16. A scanning transmission electron microscope according to claim 9 wherein the scanning transmission electron microscope further comprises a detector scanning system.

* * * * *